(12) United States Patent
Fankhauser et al.

(10) Patent No.: US 7,175,024 B2
(45) Date of Patent: Feb. 13, 2007

(54) CONFIGURABLE INSERT FOR A MANUFACTURING CARRIER

(75) Inventors: William Fankhauser, Gland (CH); Dominique Glauser, St-Sulplice (CH); Olivier Blandin, Lausanne (CH); Stephane Rohrbach, Apples (CH)

(73) Assignee: Medtronic, Inc, Minneapolis, MN (US)

( * ) Notice: Subject to any disclaimer, the term of this patent is extended or adjusted under 35 U.S.C. 154(b) by 199 days.

(21) Appl. No.: 10/424,216

(22) Filed: Apr. 25, 2003

(65) Prior Publication Data

US 2004/0211700 A1   Oct. 28, 2004

(51) Int. Cl.
*B65D 73/00* (2006.01)
*B23P 11/00* (2006.01)

(52) U.S. Cl. ............ 206/486; 206/495; 206/701; 206/722; 269/315; 269/317; 411/509

(58) Field of Classification Search .......... 206/486, 206/477, 495, 565, 701, 709, 719, 722; 269/10, 269/53, 315, 317; 29/525; 411/508, 509, 411/510, 513
See application file for complete search history.

(56) References Cited

U.S. PATENT DOCUMENTS

| | | | | |
|---|---|---|---|---|
| 3,029,486 A | * | 4/1962 | Raymond | 411/509 |
| 3,249,973 A | * | 5/1966 | Seckerson | 411/509 |
| 3,309,955 A | * | 3/1967 | Turnbull et al. | 411/509 |
| 3,810,279 A | * | 5/1974 | Swick et al. | 411/509 |
| 3,928,741 A | * | 12/1975 | Comer | 200/534 |
| 4,396,329 A | * | 8/1983 | Wollar | 411/508 |
| 4,598,821 A | | 7/1986 | La Barbara et al. | |
| 4,664,366 A | * | 5/1987 | Lane et al. | 269/303 |
| D291,864 S | * | 9/1987 | Hill | D8/354 |
| D293,880 S | * | 1/1988 | Takahashi | D8/354 |
| 4,716,633 A | * | 1/1988 | Rizo | 24/453 |
| 4,724,612 A | * | 2/1988 | Pearson | 29/850 |
| 4,793,603 A | * | 12/1988 | Wober et al. | 269/254 R |
| 4,830,556 A | * | 5/1989 | Nelson | 411/41 |
| 4,901,990 A | * | 2/1990 | Frechette | 269/25 |
| 5,301,396 A | * | 4/1994 | Benoit | 24/453 |
| 5,319,839 A | * | 6/1994 | Shimajiri | 24/453 |
| 5,337,893 A | | 8/1994 | Nami et al. | |
| 5,573,362 A | * | 11/1996 | Asami et al. | 411/509 |
| 5,651,634 A | * | 7/1997 | Kraus | 403/408.1 |
| 5,704,753 A | * | 1/1998 | Ueno | 411/509 |
| 5,774,971 A | * | 7/1998 | Manetta et al. | 29/458 |
| 5,779,057 A | * | 7/1998 | LePage et al. | 206/722 |

(Continued)

FOREIGN PATENT DOCUMENTS

GB    2124129 A   *  2/1984

(Continued)

*Primary Examiner*—Essama Omgba
(74) *Attorney, Agent, or Firm*—Paul H. McDowall; Girma Wolde-Michael (57) ABSTRACT

A manufacturing carrier has an insert that can be configured and reconfigured for a wide variety components. The carrier has a frame configured to be transported by a conveyor, an insert and at least one positioner. The insert has pin holes arranged in a matrix. The positioner is carried in a pin hole and configured for locating a component at an x axis position, a y axis position, and a z axis position in relation to the insert. The positioner is moveable from the pin hole configured for a component to another pin hole to reconfigure the insert for another component.

14 Claims, 12 Drawing Sheets

U.S. PATENT DOCUMENTS

| | | | |
|---|---|---|---|
| 5,785,484 A * | 7/1998 | Garcia | 414/416.08 |
| 5,797,714 A * | 8/1998 | Oddenino | 411/508 |
| 5,856,924 A * | 1/1999 | Brost et al. | 700/182 |
| 5,975,820 A * | 11/1999 | Kirchen | 411/339 |
| 6,029,966 A * | 2/2000 | Hertz et al. | 269/266 |
| 6,036,784 A * | 3/2000 | Huang et al. | 118/728 |
| 6,152,667 A * | 11/2000 | LeVey | 411/521 |
| 6,161,749 A * | 12/2000 | Bastacky et al. | 228/49.5 |
| 6,209,178 B1 * | 4/2001 | Wiese et al. | 24/458 |
| 6,215,098 B1 * | 4/2001 | Mizoi | 219/121.71 |
| 6,241,228 B1 * | 6/2001 | Chupick | 269/48.1 |
| 6,305,055 B1 * | 10/2001 | Castro | 24/458 |
| 6,328,507 B1 * | 12/2001 | Shoda | 409/220 |
| 6,390,460 B2 * | 5/2002 | Chupick | 269/48.1 |
| 6,474,476 B1 | 11/2002 | Anderson et al. | |
| 6,496,372 B1 * | 12/2002 | Davison et al. | 361/704 |
| 6,553,644 B2 * | 4/2003 | Karmaniolas et al. | 29/559 |
| 6,572,317 B2 * | 6/2003 | Okada et al. | 411/508 |
| 6,633,797 B1 * | 10/2003 | Akella et al. | 700/245 |
| 6,974,292 B2 * | 12/2005 | Hansen | 411/508 |
| 2004/0256780 A1 * | 12/2004 | Lang | 269/309 |

FOREIGN PATENT DOCUMENTS

| | | | |
|---|---|---|---|
| JP | 52050085 A | * | 4/1977 |

* cited by examiner

CONFIGURABLE INSERT FOR A MANUFACTURING CARRIER

This disclosure relates to the field of manufacturing equipment and more particularly to manufacturing carriers for component assembly.

BACKGROUND OF THE INVENTION

Relatively small components such as electronic devices are frequently manufactured on a manual or automated assembly line having various manufacturing stations. Small components being manufactured on an assembly line are often placed on a carrier that can be moved by a conveyor to the various manufacturing stations. The carriers typically have an insert configured to hold the component stable during manufacturing. Inserts can be configured to hold a component by creating a negative shape of the component in the insert. Inserts are typically dedicated to a specific component and are not easily reconfigurable for different components. A manufacturing facility using dedicated inserts typically maintains an inventory of a variety of insert configurations, so inserts can be rapidly changed for different components. Maintaining an inventory of insert requires space, handling, and management of the dedicated inserts. With dedicated inserts, manufacturing delays can be created when switching to new components because often a new custom dedicated insert is built off-site and must be delivered to the manufacturing facility creating. Additionally, adjustments to the dedicated insert may require the dedicated insert to be transported off-site and the dedicated insert then returned to the manufacturing facility.

Some previous carrier inserts have been configured to hold many sub-components, such as semiconductor devices, for manufacturing as shown in U.S. Pat. No. 6,474,476 "Universal carrier tray" by Anderson et al. (5 Nov. 2002) and U.S. Pat. No. 4,598,821 "Holder assembly for miniature electronic components and methods of fabrication" by LaBarbara et al. (8 Jul. 1986).

For the foregoing reasons, what is need is an insert for a manufacturing carrier that can be configured and reconfigured for a variety of components.

BRIEF SUMMARY OF THE INVENTION

A manufacturing carrier with a configurable insert is configurable and reconfigurable for a variety of components and assemblies. The manufacturing carrier with configurable insert comprises a carrier, an insert, and a positioner. The carrier has a frame that is configured to be transported by a conveyor. The insert is held by the carrier and has pin holes arranged in a matrix. The positioner is carried in at least a first pin hole and configured for locating a component at an x axis position, a y axis position, and a z axis position in relation to the insert. The positioner is moveable from the first pin hole configured for a component to a second pin hole to reconfigure the insert for another component. In some versions of the invention, the positioner comprises at least one pin, a platform and a guide. The pin is carried on a positioner proximal end and configured for insertion into at least the first pin hole with a frictional fit to secure the pin in the first pin hole. The platform is distal to the pin and configured for locating the component at the z axis position. The guide is distal to the platform and configured for locating the component at the x axis position and the y axis position.

DETAILED DESCRIPTION OF THE INVENTION

Figure 1:
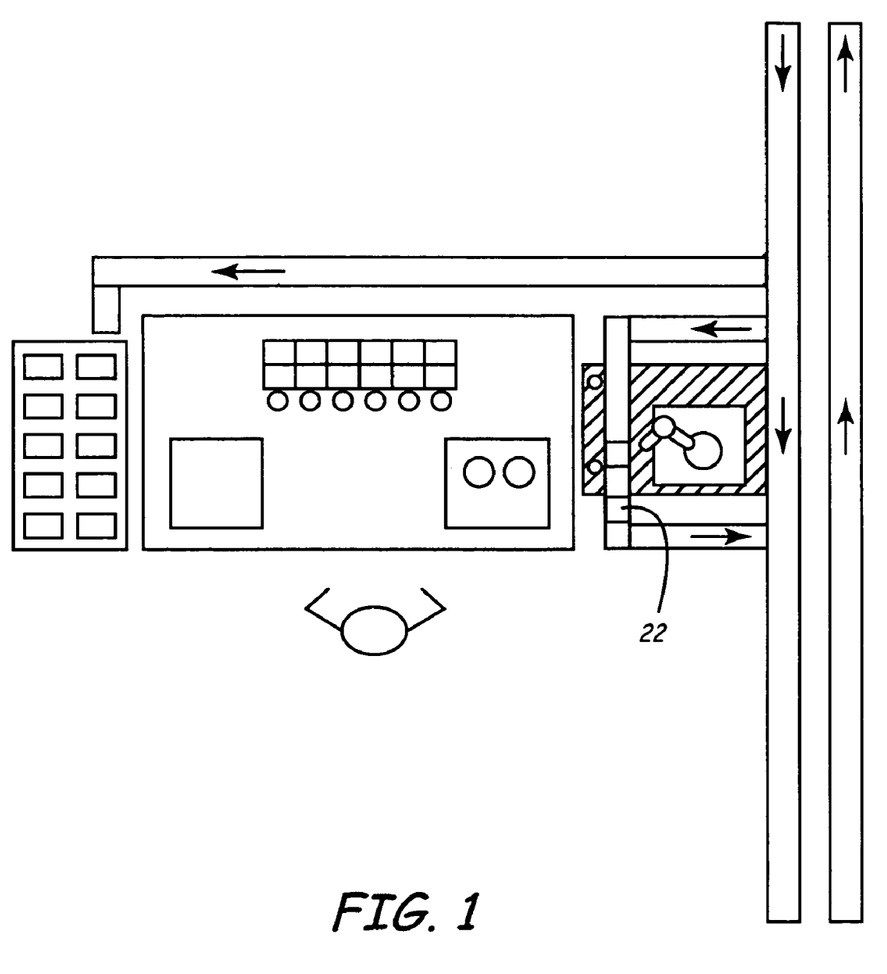
FIG. 1 shows an environment of the configurable insert for a manufacturing carrier.

FIG. 1 shows an schematic view of a configurable insert for a manufacturing conveyor system. A conveyor belt moves (depicted by arrows) a carrier pallet 22 holding an insert according to the present invention to various manufacturing stations. In some situations, manufacturing is done in a clean room environment. Such a configurable insert for use in a clean room environment is typically manufactured from a material that does not create particles. For some components, particularly semiconductor electronics, Electrical Static Discharge (ESD) can damage components during manufacturing, so the configurable insert should not create an ESD. In some manufacturing environments, the configurable insert should be compatible with high temperatures and humidity, such a temperature of 60 degree centigrade and 50% humidity. For some components such as implantable medical devices (IMDs) which are devices that are oftentimes designed with ergonomic rounded shaped (compatible with implantation in a human body. However, a configurable insert according to the invention is typically compatible with irregular shaped and rounded components.

Figure 2:
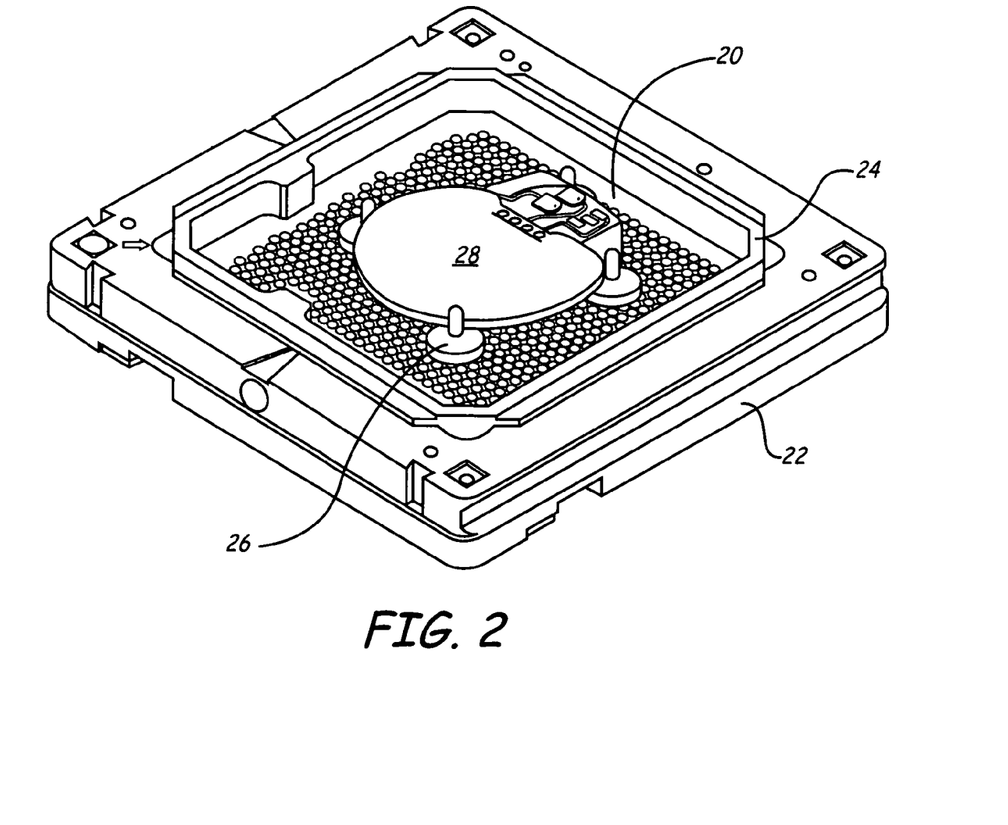
FIG. 2 shows a view of an insert in a frame with positions configured for a first component embodiment.
Figure 3:
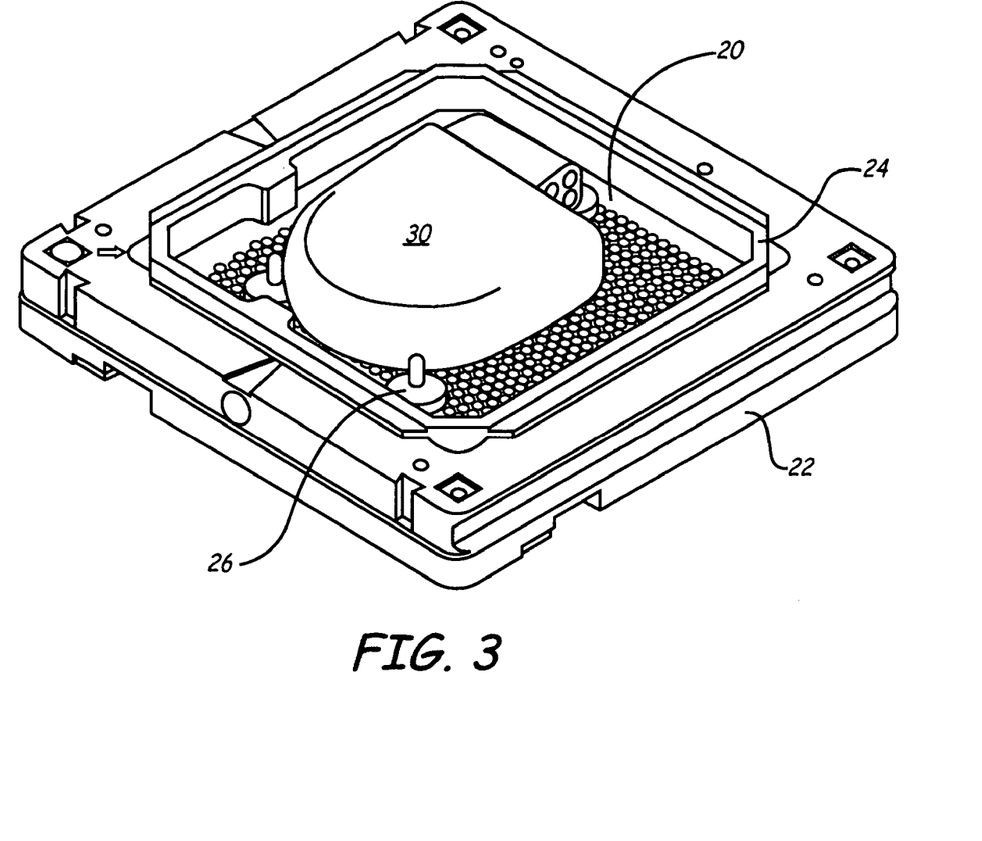
FIG. 3 shows an insert in a frame with positioners reconfigured for a second component embodiment.
Figure 4:
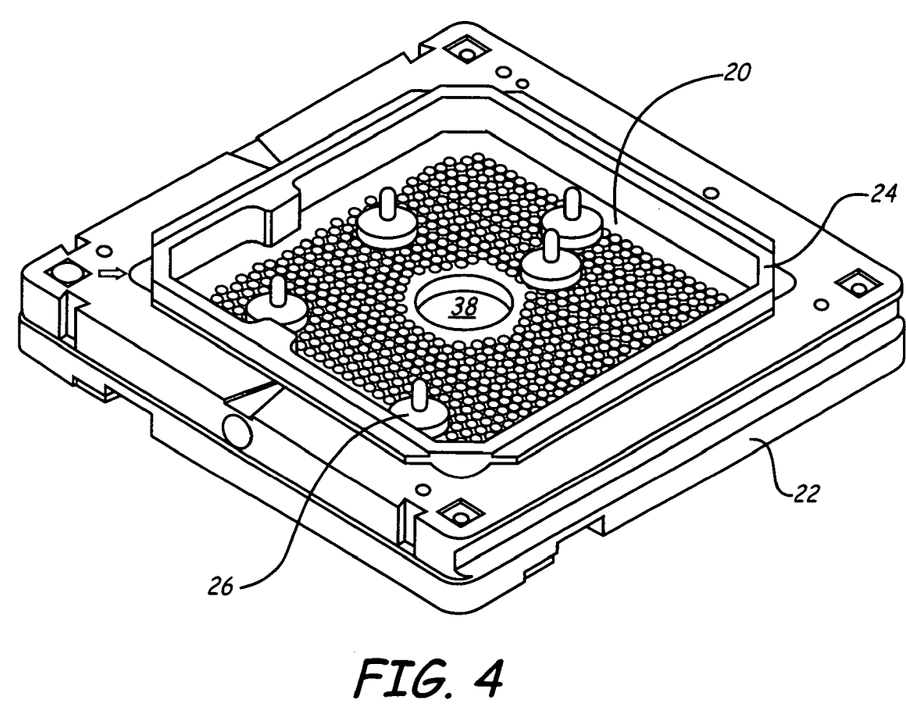
FIG. 4 shows an insert in a frame with positioners embodiment.

FIG. 2 shows a view of an insert 20 having a frame 24 with positioners 26 configured for a first component 28, and FIG. 3 shows the insert 20 disposed within the frame 24 with positioners 26 reconfigured for a second component 30. The configurable insert 20 can be adapted to a wide range of component shapes (28,30).

Now referring collectively to FIG. 4 through FIG. 7, FIG. 4 shows an insert 20 disposed in a frame 24 with positioners 26. The configurable insert 20 for a manufacturing conveyor comprises a manufacturing carrier 22, an insert 20, and a positioner 26. The manufacturing carrier 22 has a frame 24 and is configured to be transported by a conveyor (e.g., the schematic depiction of FIG. 1). The frame 24 can be any type of frame capable of holding the insert 20 such as a frame and the like. The conveyor engages the carrier 22 to move the carrier 22 to selected positions for component manufacturing actions. The conveyor can be any type of conveyor system capable of transporting the carrier such as a Bosch TS1 conveyor system and the like. The insert 20 is held by the carrier 22 and has a first side, a second side, and pin holes (depicted in FIGS. 5–7 and denoted by reference numeral 36) arranged for example in a matrix. The pin holes 36 can be any size and number that are compatible with the component being manufactured. In some versions, the pin holes 36 have a minimum diameter of 2.0 millimeters with a maximum diameter of 2.1 millimeters. The pin holes 36 can be arrayed in any pattern that support the components to be manufactured (28,30 of F(FIGS. 2 and 3). In some versions, the pin hole center can have a center to center spacing of about 2.5 millimeter in a first direction and a center to center spacing of about 1.5 millimeters in a second direction. The insert 20 can have a manufacturing hole 38 formed in the insert 20 to provide access to a component (e.g., 28,30) through the insert 20. The manufacturing hole 38 can be any size and shape that provides access to the component while avoiding interference with the positioner 26. In some versions, the manufacturing hole 38 is about 18.0 millimeters. The insert 20 can be manufactured from a material such as a PE1000 AST available from Ottensteiner Kunststoff GmbH in Germany and the like.

Figure 5:
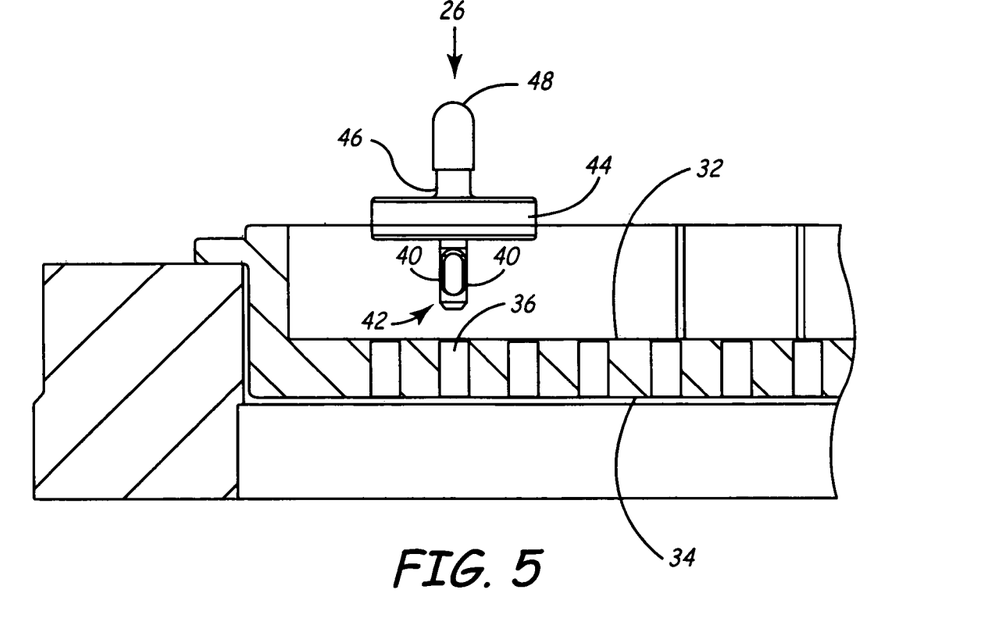
FIG. 5 shows sectioned view of an insert and frame with a positioner aligned for insertion embodiment.
Figure 6:
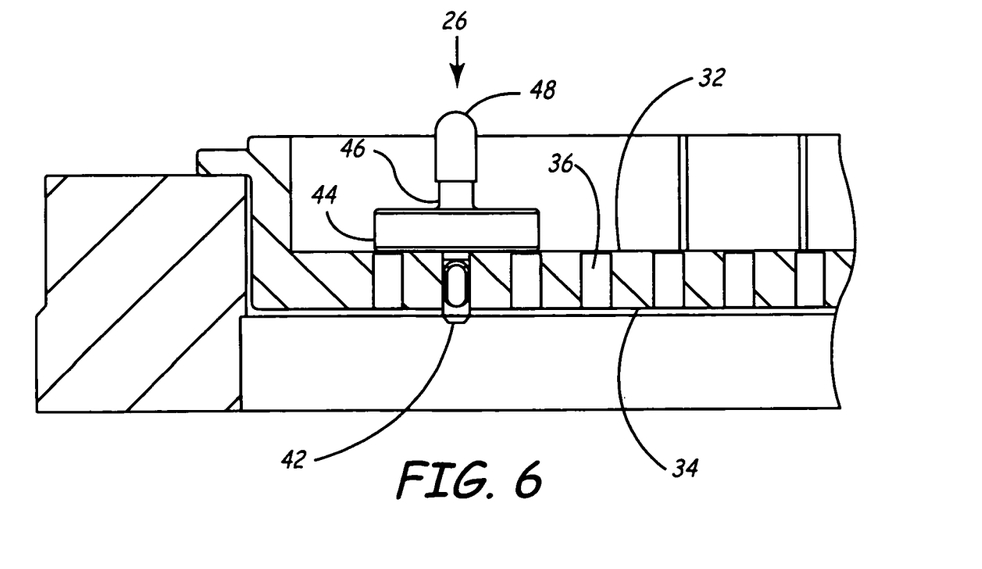
FIG. 6 shows sectioned view of an insert and frame with a positioner inserted into the insert embodiment.
Figure 7:
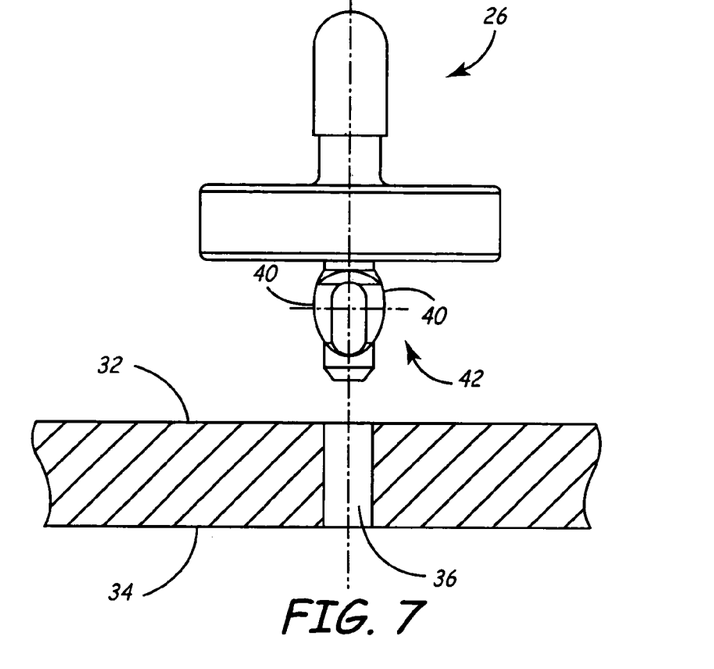
FIG. 7 shows an enlarged sectioned view of an insert with a positioner aligned for insertion embodiment.
Figure 8:
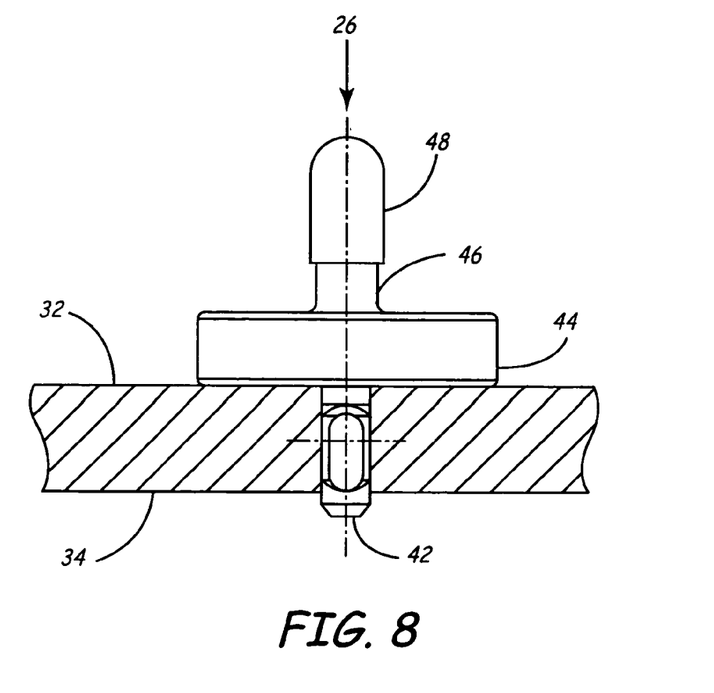
FIG. 8 shows an enlarged sectioned view of an insert with a positioner inserted into the insert embodiment.

FIG. 5 depicts a cross-sectional view of an insert and frame with a positioner 26 aligned for insertion, and FIG. 6 shows cross-sectional view of an insert and frame with a positioner 26 inserted therein. FIG. 7 shows an enlarged sectioned view of an insert with a positioner aligned 26 for insertion, and FIG. 8 shows an enlarged sectioned view of an insert with a positioner 26. In FIG. 7, an exemplary pin spring 40 comprises a leaf spring with an exaggerated generally centrally located expanded portion to provide pin spring compression (as depicted in FIG. 8). The positioner 26 is carried in at least a first pin hole 36 and is configured for locating a component at an x-axis position, a y-axis position, and a z-axis position in relation to the insert. The positioner 26 is moveable from the first pin hole 36 configured for a component to any second pin hole to reconfigure the insert 20 for another component. Some embodiments of the configurable insert 20 can include a second positioner or any number of positioners that are needed to secure a component to the insert 20. The second positioner can be carried in at least a third pin hole and configured for cooperating with the first positioner for locating the component at the x-axis position, the y-axis position, and the z-axis position in relation to the insert 20. The second positioner is moveable from the third pin hole configured for the component to a forth pin hole to reconfigure the insert 20 for yet another component.

The positioner 26 has at least one pin portion 42, a platform 44 and a guide member 46,48. The pin 42 is carried on a first positioner proximal end and configured for insertion into at least the first pin hole 36 with a frictional fit (via spring 40) to secure the pin 26 in the first pin hole 36. The pin 42 can include a pin spring to control insertion force (e.g., spring 40) and extraction force within pin hole tolerances. The pin spring 40 can be any spring that will form an appropriate frictional fit. In some versions, the pin spring comprises stainless steel leaf springs and in some versions the spring can be an elastomeric material carried on the pin 42. Pin insertion force and extraction force are largely dependent upon tolerances of the pin holes 36 and the pin 42 and along with the materials selected for the insert 20. Pin extract force can be selected to be high enough so the positioner 26 does not fall out of the pin hole 36 if the insert 20 is turned upside down. In some embodiments, pin insertion force and pin extraction force are in the range from two Newtons and ten Newtons. The pin 42 serves as means for insertion carried on a positioner proximal end configured for insertion into at least one pin hole 36 with a frictional fit to secure the positioner 26 in the pin hole 36.

The platform 44 comprises a portion distal to the pin 42 and configured for locating the component at the z-axis position. In some versions, the platform 44 is sized to raise the component just a few millimeters from the insert 20 such as about 3.0 millimeters. In some embodiments, the platform 44 can be configured so one or more grommets (denoted schematically by reference numeral 48), such as a cover over a screw access hole, and may be configured to not contact the insert 20, which may damage the grommets. The platform 44 serves as a means for z-axis positioning distal to the means for inserting (pin). The means for z-axis positioning is configured for locating the component at a z-axis position. The guide 46 (which operatively can include grommet 48) is distal to the platform 44 and configured for locating the component at the x-axis position and the y-axis position. The guide 48 serves as a means for guiding distal to the means for x-axis positioning. The means for guiding can be configured for locating the component at an x-axis position and a y-axis position.

Some embodiments of the positioner 26 can include a grip member 48 distal to the guide. The grip 48 is configured for grasping the positioner 26 to move the positioner 26 from a first pin hole 36 to a second pin hole. Said pin hole 36 can comprise a through-hole bored through a first surface 32 and an opposing surface 34 of the insert 20. The grip 48 serves as a means for gripping distal to the means for guiding. The means for gripping 48 configured for grasping the positioner 26 to move it. The grip 48 is graspable by a robotic machine to move the first positioner 26 from the first pin hole 36 to a second pin hole. The positioner 26 serves as a means for positioning carried in a first pin hole 36 configured for locating a component at an x-axis position, a y-axis position, and a z-axis position in relation to the insert 20. The means for positioning is moveable from the first pin hole 36 configured for a first component to a second pin hole to reconfigure the insert 20 for another component.

Figure 9:
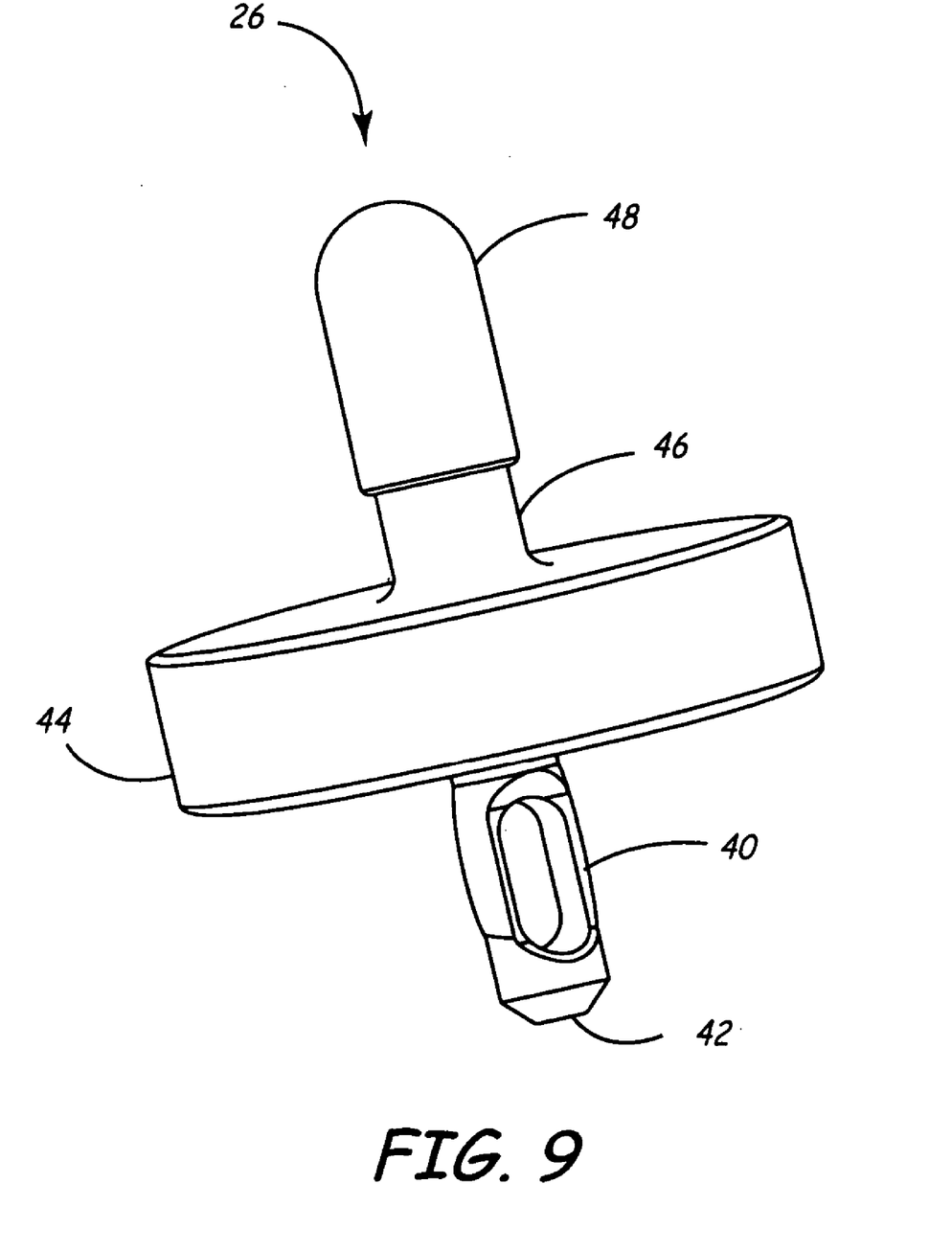
FIG. 9 shows a positioner embodiment.
Figure 10:
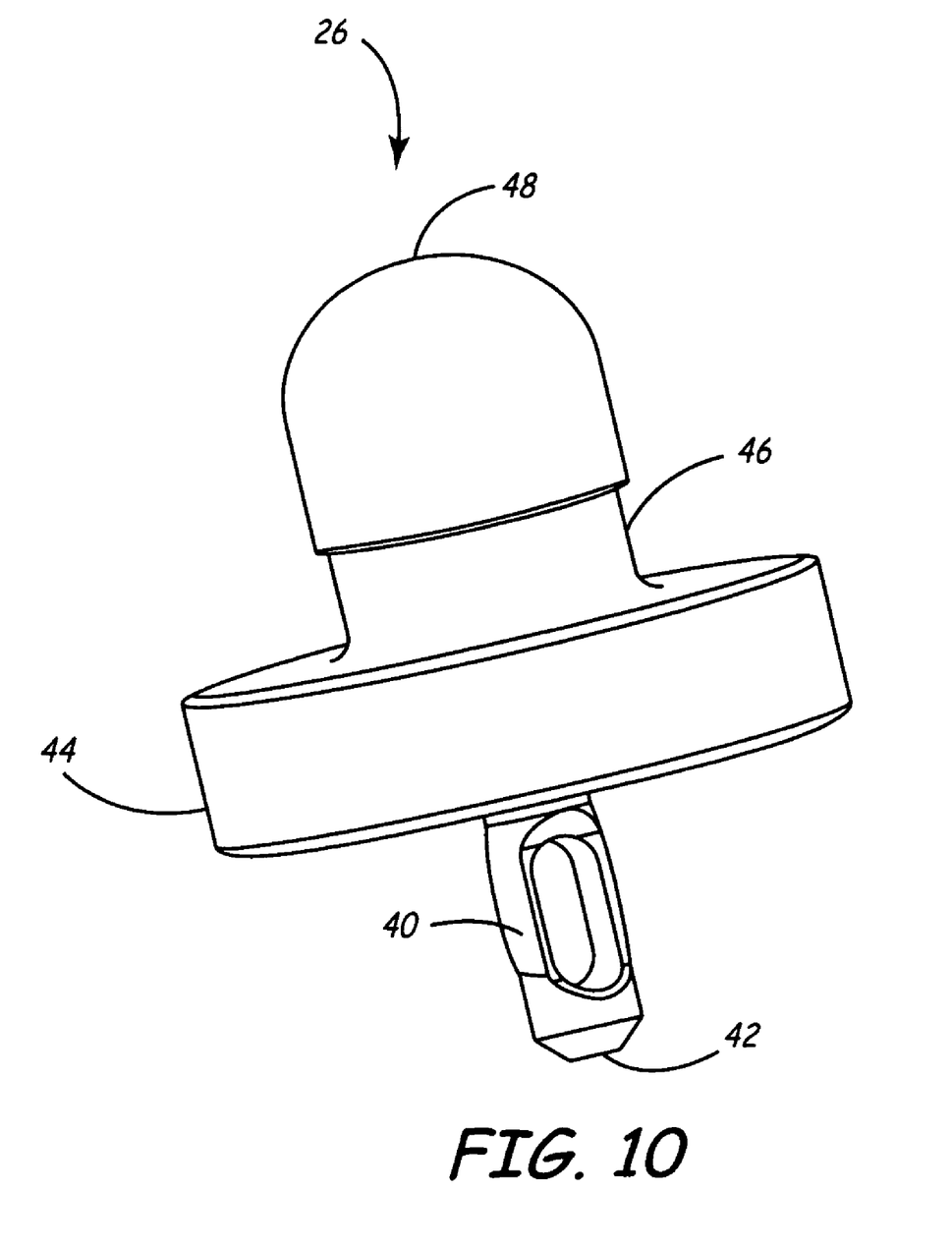
FIG. 10 shows another positioner embodiment.
Figure 11:
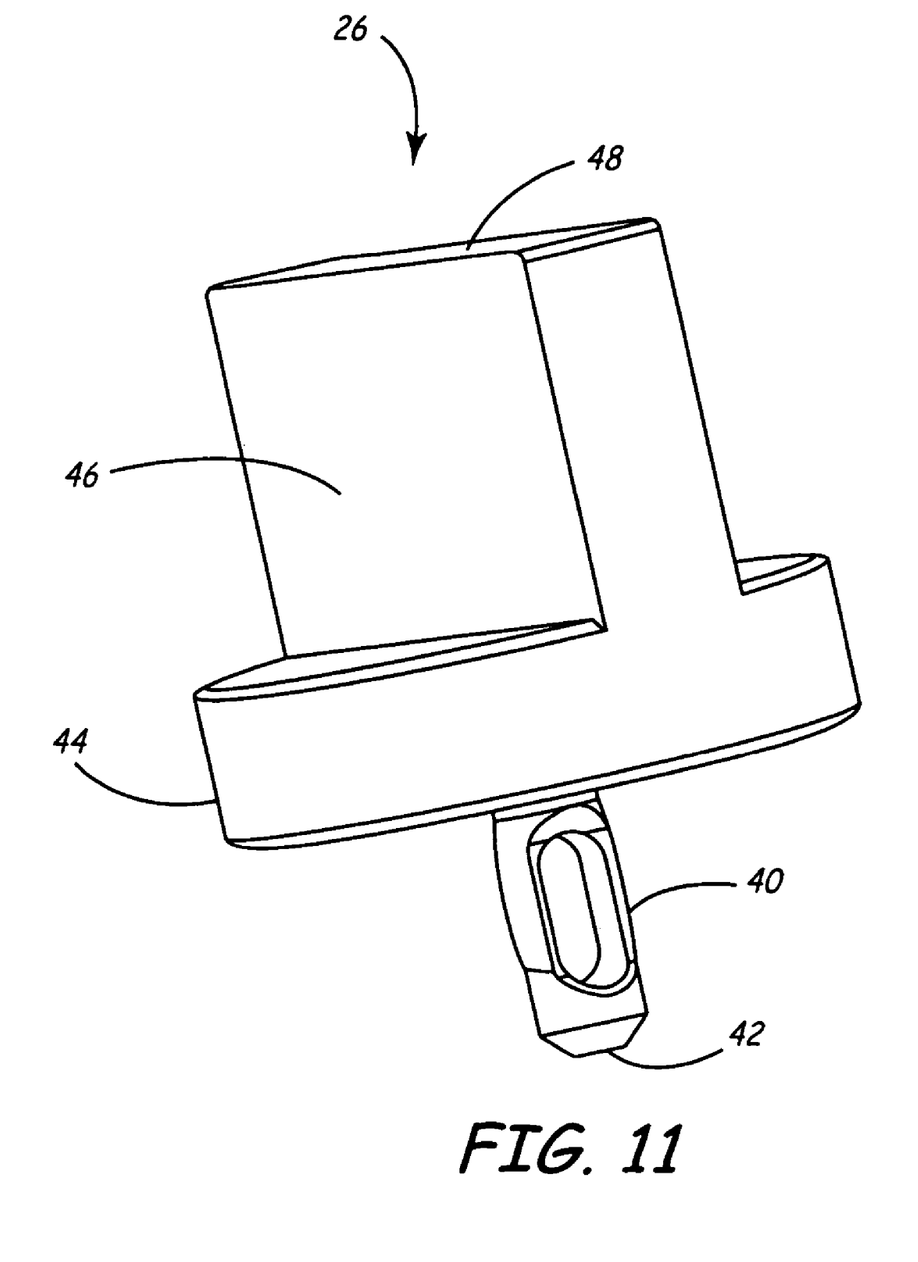
FIG. 11 shows yet another positioner embodiment.
Figure 12:
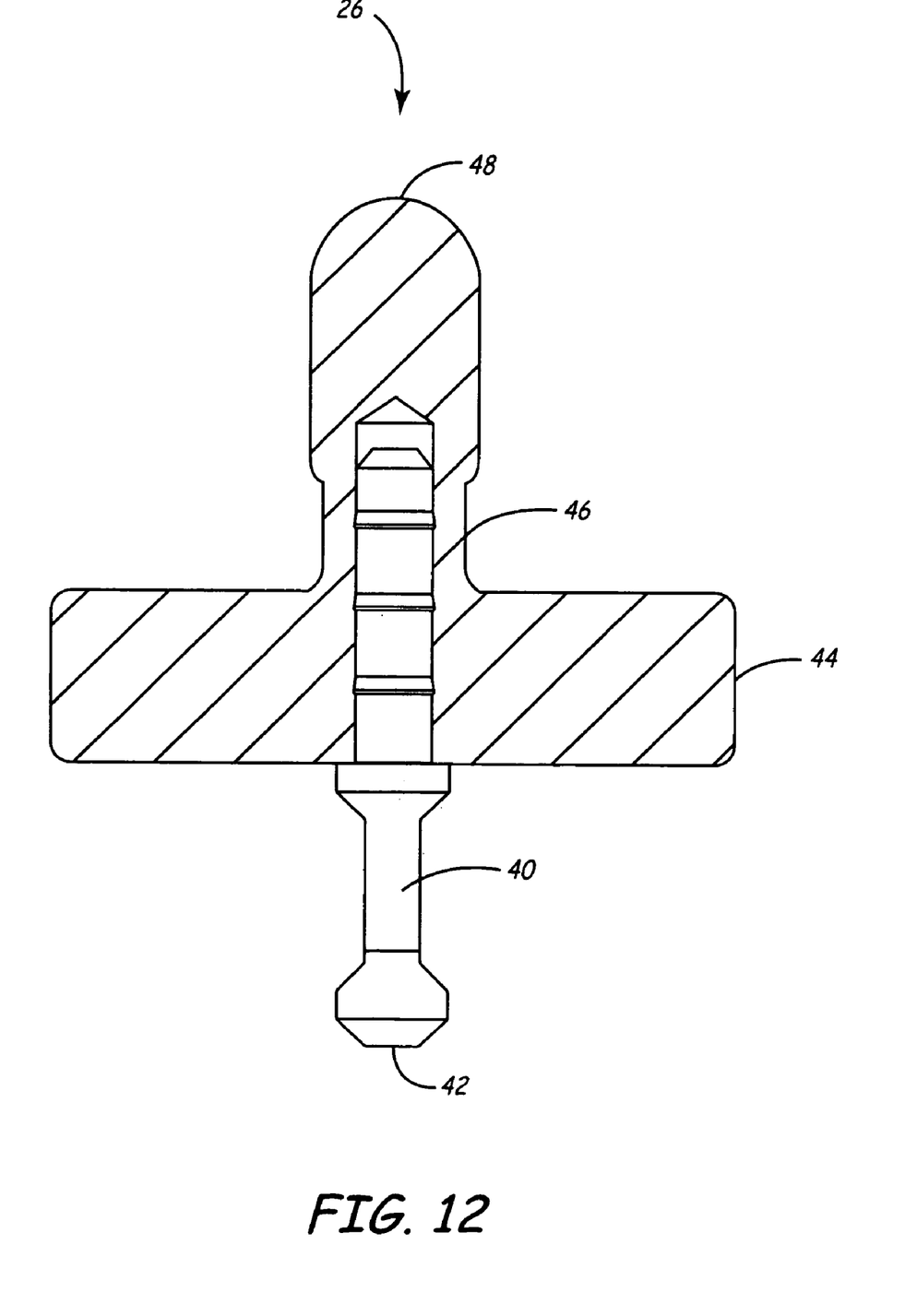
FIG. 12 shows a sectioned view of a positioner embodiment.

FIGS. 9–11 show exemplary positioner elements for certain embodiments of the invention, and FIG. 12 shows a sectioned view of a positioner depicting internal structure and wherein platform 44 is integrated with grommet or grip member 48. In this view, the pin is rotated to provide a side view of the pin spring.

The positioner 26 can be manufactured from a wide variety of materials having any shape and size that is compatible with the insert 20 and the component being manufactured. In some versions, the positioner 26 can have a core manufactured from stainless steel and an exterior manufactured from a POM plastic such as Delrin.RTM. AST available from DuPont. In environments where the positioner 26 is required to be used in a clean room environment and thus Electrical Static Discharge (ESD) compatible, the positioner 26 can be manufactured from material that have little or no particle emission and little or no potential for acquiring an electrical charge. For positioner assemblies 26 intended to be positioned by automated equipment, the positioner pin 40,42 should be manufactured from a material that will maintain relatively consistent extraction forces.

Figure 13:
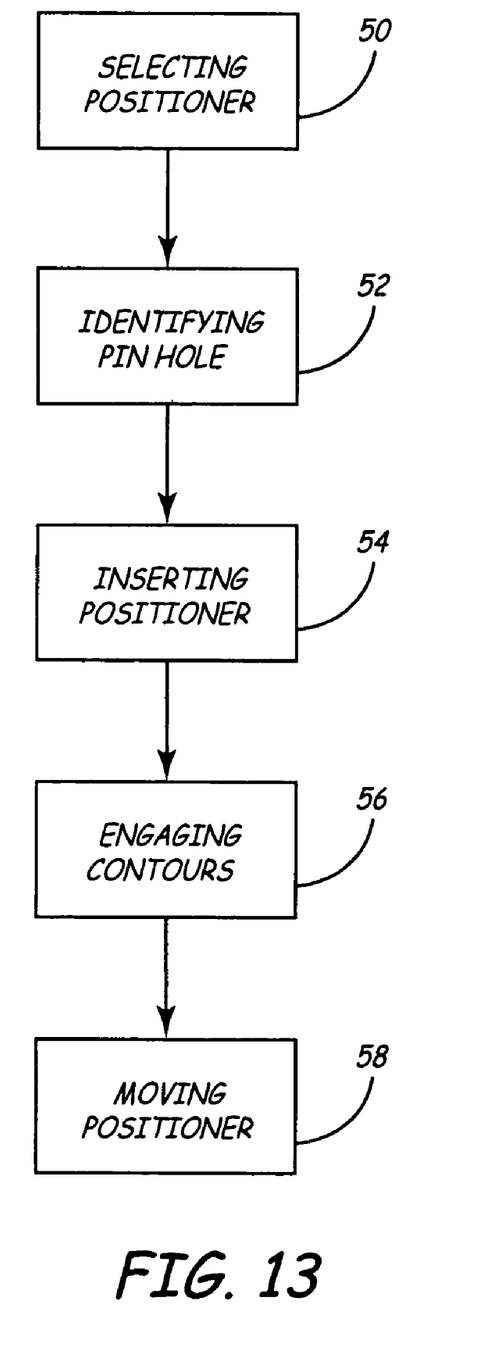
FIG. 13 shows a flowchart of a method for configuring an insert of a manufacturing carrier embodiment.

FIG. 13 depicts a flowchart for a method of configuring an insert 20 of a manufacturing carrier. At step 50, a positioner 26 is selected and at step 52 one or more pin holes 36 for use with a component (e.g., 28,30 of FIGS. 2–3) is identified. At step 54, the positioner 26 is inserted into the insert 20 in a convenient location given the contours of a first component to be manufactured. The contours of the component can be determine in many way such as a template scaled for a first component outline, a computer readable file, an automated imaging machine and the like. A positioner 26 is thus selecting having an appropriate platform 44 to locate the first component at a z-axis position and a guide 46,48 to locate the first component at an x-axis position and a y-axis position. As noted, the first pin hole 36 is identified on an insert 20 that corresponds to a positioner location to engage contours of the first component. The positioner 26 is inserted into the first pin hole 36 on the insert 20 to locate the positioner 26 at the x-axis position and the y-axis position on the insert 20. At step 56 the positioner 26 engages the contours of the component to locate the component at the x-axis position, the y-axis position, and the z-axis position. Some versions of the method can also include additional elements such as inserting additional positioners. At step 58 the positioner 26 is moved from the first pin hole configured for the first component to a second pin hole to reconfigure the insert for a second component.

Figure 14:
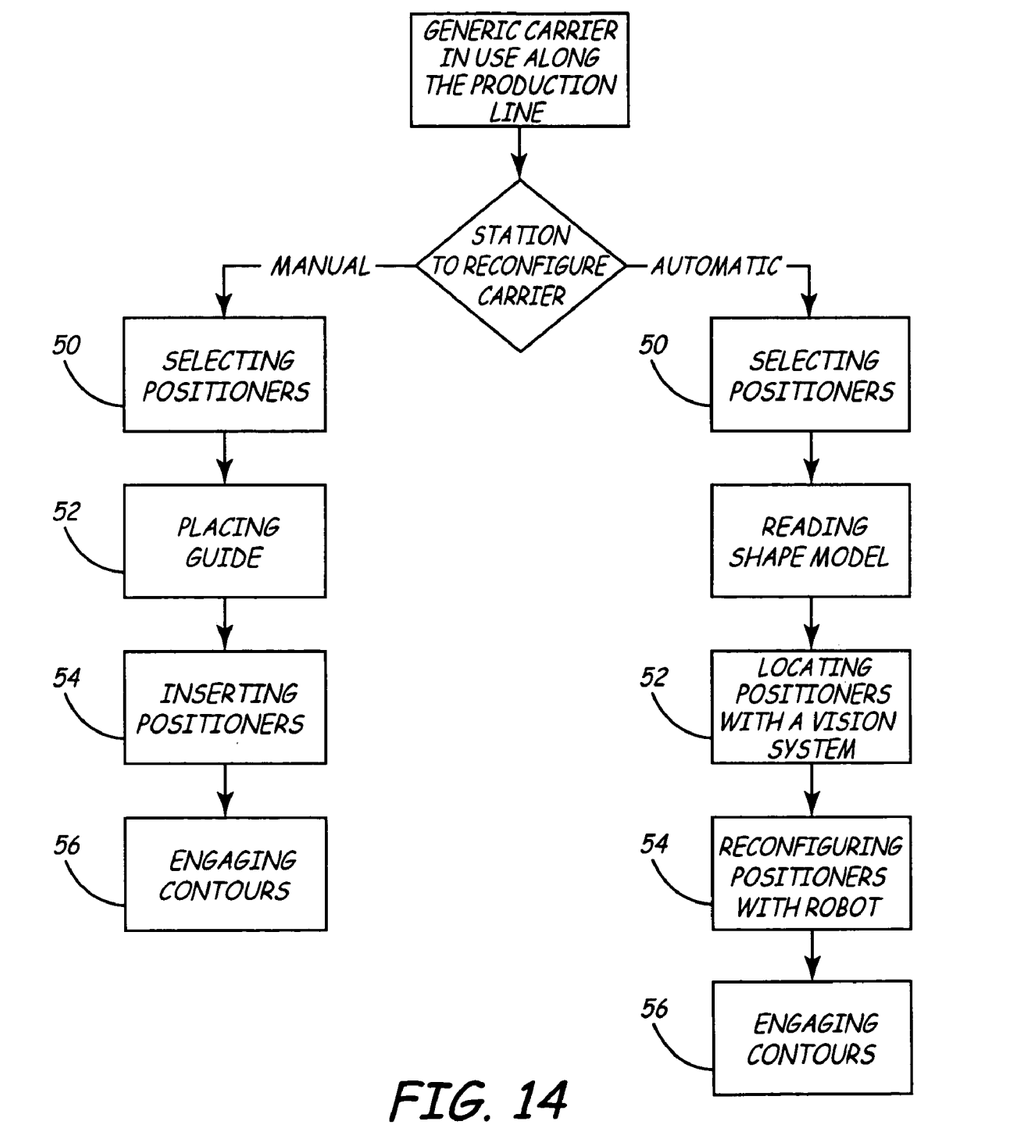
FIG. 14 shows a flowchart of a method for manual and automatic insert reconfiguration embodiment.

FIG. 14 depicts a flowchart of a method for both manual and automatic insert reconfiguration. The manufacturing carrier 22 with configurable insert 20 can be manually reconfigured (e.g., as described with respect to FIG. 13), automatically reconfigured (as depicted on the right-hand side of FIG. 14 using similar reference numerals), or a combination of manual and automatic reconfiguration (not specifically depicted). The method for manual reconfiguration comprises selecting positions 50, placing guide 52, inserting positions 54 and engaging contours 56. The guide used can be a paper template that is representative of a component. The positioners 26 are inserted according to the guide. The method for automatically reconfiguration comprises selecting positioners 50, reading shape model (depicted but not denoted by a reference numeral), locating positioners with a vision system 52, reconfiguring positioners 54, and engaging contours 56. The positions are reconfigured with a robot according to a predefined shape determined by the vision system.

Thus, embodiments of the manufacturing carrier with configurable insert are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A manufacturing carrier with a configurable insert, comprising:
    a carrier having a frame, the carrier configured to be transported by a conveyor;
    an insert held by the carrier, the insert having a first side, a second side, and pin holes arranged in a matrix;
    a first positioner carried in at least a first pin hole, the first positioner configured for locating a component at an x axis position, a y axis position;
    and a z axis position in relation to the insert;
    at least one pin carried on a first positioner proximal end, the pin configured for insertion into at least the first pin hole with a frictional fit to secure the pin in the first pin hole;
    a platform distal to the pin, the platform configured for locating the component at the z axis position; and
    a guide distal to the platform, the guide configured for locating the component at the x axis position and the y axis position,
    wherein the first positioner is moveable from the first pin hole configured for a component to a second pin hole to reconfigure the insert for another component.

2. The manufacturing carries as in claim 1, further comprising:
    a second positioner carried in at least a third pin hole, the second positioner configured for cooperating with the first positioner for locating the component at the x axis position, the y axis position, and the z axis position in relation to the insert;
    wherein the second positioner is moveable from the third pin hole configured for the component to forth pin hole to reconfigure the insert for another component.

3. The manufacturing carrier as in claim 1, further comprising a grip distal to the guide, the grip configured for grasping the first positioner to move the first positioner from the first pin hole to the second pin hole.

4. The manufacturing carrier as in claim 3, wherein the grip is graspable by a robotic machine to move the first positioner from the first pin hole to the second pin hole.

5. The manufacturing carrier as in claim 1, wherein the first positioner pin includes a pin spring to control insertion force and extraction force within pin hole tolerances.

6. The manufacturing carrier as in claim 5, wherein the insertion force is less than about five Newtons and the extraction form is greater than about two Newtons.

7. The manufacturing carrier as in claim 1 further comprising, a conveyor that engages the carrier to move the carrier to selected positions for component manufacturing actions.

8. The manufacturing carrier as in claim 1 further comprising, a manufacturing hole formed in the insert to provide access to the component through the insert.

9. A positioner according to claim 1, wherein the component comprises an implantable medical device.

10. A positioner according to claim 9 wherein the implantable medical device includes at least one of an irregular shape and a rounded shape.

11. A configurable insert for a manufacturing carrier, comprising:
    an insert having a first side, a second side, and a plurality of pin holes arranged in a matrix;
    a first positioner carried in at least a first pin hole, the first positioner configured for locating a component at an x axis position, a y axis position, and a z axis position in relation to the insert, the first positioner including, at least one pin carried on a first positioner proximal end, the pin configured for insertion into the first pin hole with a frictional fit to secure the pin in the pin hole;
    a platform distal to the pin, the platform configured for locating the component at the z axis position; and
    a guide distal to the platform, the guide configured for locating the component at the x axis position and y axis position;
    wherein the positioner is moveable from the pin hole configured for a component to another pin hole to reconfigure the insert for another component.

12. The configurable insert as in claim 11, further comprising a grip distal to the guide, the grip configured for grasping the first positioner to move the first positioner.

13. A positioner according to claim 11, wherein the component comprises an implantable medical device.

14. A positioner according to claim 13, wherein the implantable medical device includes at least one of an irregular shape and a rounded shape.

* * * * *